(12) United States Patent
Yang et al.

(10) Patent No.: US 11,254,312 B2
(45) Date of Patent: Feb. 22, 2022

(54) AUTONOMOUS VEHICLE SIMULATION SYSTEM

(71) Applicant: TUSIMPLE, INC., San Diego, CA (US)

(72) Inventors: Yixin Yang, San Diego, CA (US); Dinghua Li, San Diego, CA (US)

(73) Assignee: TUSIMPLE, INC., San Diego, CA (US)

(*) Notice: Subject to any disclaimer, the term of this patent is extended or adjusted under 35 U.S.C. 154(b) by 230 days.

(21) Appl. No.: 16/435,437

(22) Filed: Jun. 7, 2019

(65) Prior Publication Data
US 2020/0384998 A1    Dec. 10, 2020

(51) Int. Cl.
| | |
|---|---|
| *B60W 30/18* | (2012.01) |
| *G05D 1/00* | (2006.01) |
| *B60W 10/04* | (2006.01) |
| *B60W 10/18* | (2012.01) |
| *B60W 10/20* | (2006.01) |
| *B60W 50/00* | (2006.01) |
| *G06F 3/14* | (2006.01) |
| *G05B 17/02* | (2006.01) |

(52) U.S. Cl.
CPC ............ *B60W 30/18* (2013.01); *B60W 10/04* (2013.01); *B60W 10/18* (2013.01); *B60W 10/20* (2013.01); *B60W 50/00* (2013.01); *G05B 17/02* (2013.01); *G05D 1/0088* (2013.01); *G06F 3/14* (2013.01); *B60W 2050/0028* (2013.01); *B60W 2400/00* (2013.01); *B60W 2420/42* (2013.01); *B60W 2420/52* (2013.01); *B60W 2520/10* (2013.01); *B60W 2556/00* (2020.02); *B60W 2710/18* (2013.01); *B60W 2710/20* (2013.01); *B60W 2720/106* (2013.01)

(58) Field of Classification Search
CPC .................................................... B60W 10/18
See application file for complete search history.

(56) References Cited

U.S. PATENT DOCUMENTS

| | | | | |
|---|---|---|---|---|
| 10,139,828 B2* | 11/2018 | Ho | ........................ | B60W 30/00 |
| 10,466,709 B2* | 11/2019 | Kurata | .................. | G05D 1/0274 |
| 10,599,155 B1* | 3/2020 | Konrardy | ........... | B60W 60/0011 |
| 10,824,145 B1* | 11/2020 | Konrardy | ................ | B60R 25/10 |
| 2016/0314224 A1* | 10/2016 | Wei | ......................... | G06F 30/20 |
| 2019/0129831 A1* | 5/2019 | Goldberg | ............ | G06F 3/04847 |
| 2019/0303759 A1* | 10/2019 | Farabet | ................. | G06K 9/4628 |
| 2020/0074266 A1* | 3/2020 | Peake | ................... | G06K 9/6256 |

FOREIGN PATENT DOCUMENTS

CN        112051070 A  * 12/2020  ............ B60W 10/04

* cited by examiner

*Primary Examiner* — Michael A Berns
(74) *Attorney, Agent, or Firm* — Paul Liu; Perkins Coie, LLP

(57) ABSTRACT

Techniques for analysis of autonomous vehicle operations are described. As an example, a method of autonomous vehicle operation includes storing sensor data from one or more sensors located on the autonomous vehicle into a storage medium, performing, based on at least some of the sensor data, a simulated execution of one or more programs associated with the operations of the autonomous vehicle, generating, based on the simulated execution of the one or more programs and as part of a simulation, one or more control signal values that control a simulated driving behavior of the autonomous vehicle, and providing a visual feedback of the simulated driving behavior of the autonomous vehicle on a simulated road.

16 Claims, 4 Drawing Sheets

AUTONOMOUS VEHICLE SIMULATION SYSTEM

TECHNICAL FIELD

This document relates to techniques to perform simulations based on data obtained from one or more sensors and/or software operating on an autonomous vehicle.

BACKGROUND

A vehicle may include sensors for several purposes. For example, sensors may be attached to the front and rear bumpers of a car to provide audible and/or visual cues to the driver to indicate a proximity of an object to the car. In another example, sensors may be installed on a roof of a vehicle to facilitate autonomous driving. Sensors can obtain data related to one or more areas that surround a vehicle. The sensor data can be processed to obtain information about the road or about the objects surrounding the autonomous vehicle. Thus, the sensor data obtained from the sensors on an autonomous vehicle can be used to safely maneuver the autonomous vehicle through traffic or on a highway.

SUMMARY

A vehicle simulation computer includes a graphical user interface (GUI) that allows a user to play back data obtained from one or more sensors on an autonomous vehicle, such as an autonomous semi-trailer truck. The vehicle simulation computer GUI can enable the user to play and view the sensor data between a user-configurable time period so that the user can determine whether an algorithm for autonomous driving is performing as designed within the user selected time period. The vehicle simulation computer can also be used as a debugging and/or error analysis tool to reconstruct or recreate virtual scenarios based on both real-world sensor data and revised algorithm for autonomous driving.

In an exemplary embodiment, a method of autonomous vehicle operation is described. The method comprises storing sensor data from one or more sensors located on the autonomous vehicle into a storage medium, performing, based on at least some of the sensor data, a simulated execution of one or more programs associated with the operations of the autonomous vehicle, generating, based on the simulated execution of the one or more programs and as part of a simulation, one or more control signal values that control a simulated driving behavior of the autonomous vehicle, and providing a visual feedback of the simulated driving behavior of the autonomous vehicle on a simulated road.

In some embodiments, the method further comprises determining, based on the one or more control signal values, location and speed of the autonomous vehicle, where the visual feedback of the simulated driving behavior of the autonomous vehicle is based on the determined location and speed of the autonomous vehicle. In some embodiments, the method further comprises receiving a user-configurable time period information that controls an amount of the sensor data used for the performing of the simulated execution, where the sensor data used for the performing of the simulated execution includes time stamp that falls within the user-configurable time period information. In some embodiments, the providing the visual feedback of the simulated driving behavior of the autonomous vehicle includes displaying the one or more control signal values.

In some embodiments, the displaying the one or more control signal values includes displaying a difference between the one or more control signal values and a corresponding one or more previous control signal values. In some embodiments, the one or more control signal values includes a steering angle value that steers the autonomous vehicle, a throttle value that adjusts a speed of the autonomous vehicle, or a braking value that adjusts an amount of brakes engaged by the autonomous vehicle. In some embodiments, the at least some of the sensor data used for the simulated execution of the one or more programs excludes sensor data from a disabled sensor.

In some embodiments, the one or more sensors includes a camera, a radar, or a LiDAR. In some embodiments, the one or more programs includes a revised program that fixed a software issue with a previous program, where the revised program replaced the previous program, and where the revised program and previous program have different version identifiers.

In another exemplary embodiment, a computer readable program stored on a non-transitory computer readable media is described. The computer readable program includes code that when executed by a processor, causes the processor to: store sensor data from one or more sensors located on the autonomous vehicle into a storage medium, perform, based on at least some of the sensor data, a simulated execution of one or more programs associated with the operations of the autonomous vehicle, generate, based on the simulated execution of the one or more programs and as part of a simulation, one or more control signal values that control a simulated driving behavior of the autonomous vehicle, and provide a visual feedback of the simulated driving behavior of the autonomous vehicle on a simulated road.

In some embodiments, the processor is further configured to determine, based on the one or more control signal values, location and speed of the autonomous vehicle, where the visual feedback of the simulated driving behavior of the autonomous vehicle is based on the determined location and speed of the autonomous vehicle. In some embodiments, the processor is further configured to receive a user-configurable time period information that controls an amount of the sensor data to be used for the performed simulated execution, where the sensor data used for the performed simulated execution includes time stamp that falls within the user-configurable time period information. In some embodiments, the processor configured to provide visual feedback of the simulated driving behavior of the autonomous vehicle includes the processor configured to display the one or more control signal values.

In some embodiments, the processor configured to display of the one or more control signal values includes the processor configured to display a difference between the one or more control signal values and a corresponding one or more previous control signal values.

In yet another exemplary embodiment, a device that includes a processor that is configured or operable to perform the above-described methods is disclosed.

The above and other aspects and their implementations are described in greater detail in the drawings, the descriptions, and the claims.

DETAILED DESCRIPTION

A conventional sensor data playback system for analyzing sensor data has several drawbacks. A conventional sensor data playback system collects sensor data from a vehicle, saves the sensor data on a file, and then plays back the sensor data in a chronological order. However, conventional sensor data playback systems do not provide a tool to play or replay sensor data from a relevant time period, and they do not provide users the ability to select playback from a specific data source, such as one of the sensors. Furthermore, conventional sensor data playback systems do not include a user interface to customize playback speed of sensor data (e.g., fast forward or rewind) as the sensor data is being visualized. Finally, conventional sensor data playback systems do not show the programmer or developer the impact that the revised algorithm or software code makes on the overall autonomous vehicle system. Thus, conventional sensor data playback systems do not easily allow a programmer to determine whether a revised algorithm or software code has fixed a software bug in one module without affecting other modules of the autonomous vehicle system.

This patent document describes an exemplary vehicle simulation computer with data playback feature that can overcome at least the drawbacks of conventional sensor data playback system. The exemplary vehicle simulation computer offers several technical features to users such as programmers or software developers who can analyze data obtained by one or more sensors on an autonomous vehicle, such as a semi-trailer truck.

Figure 1:
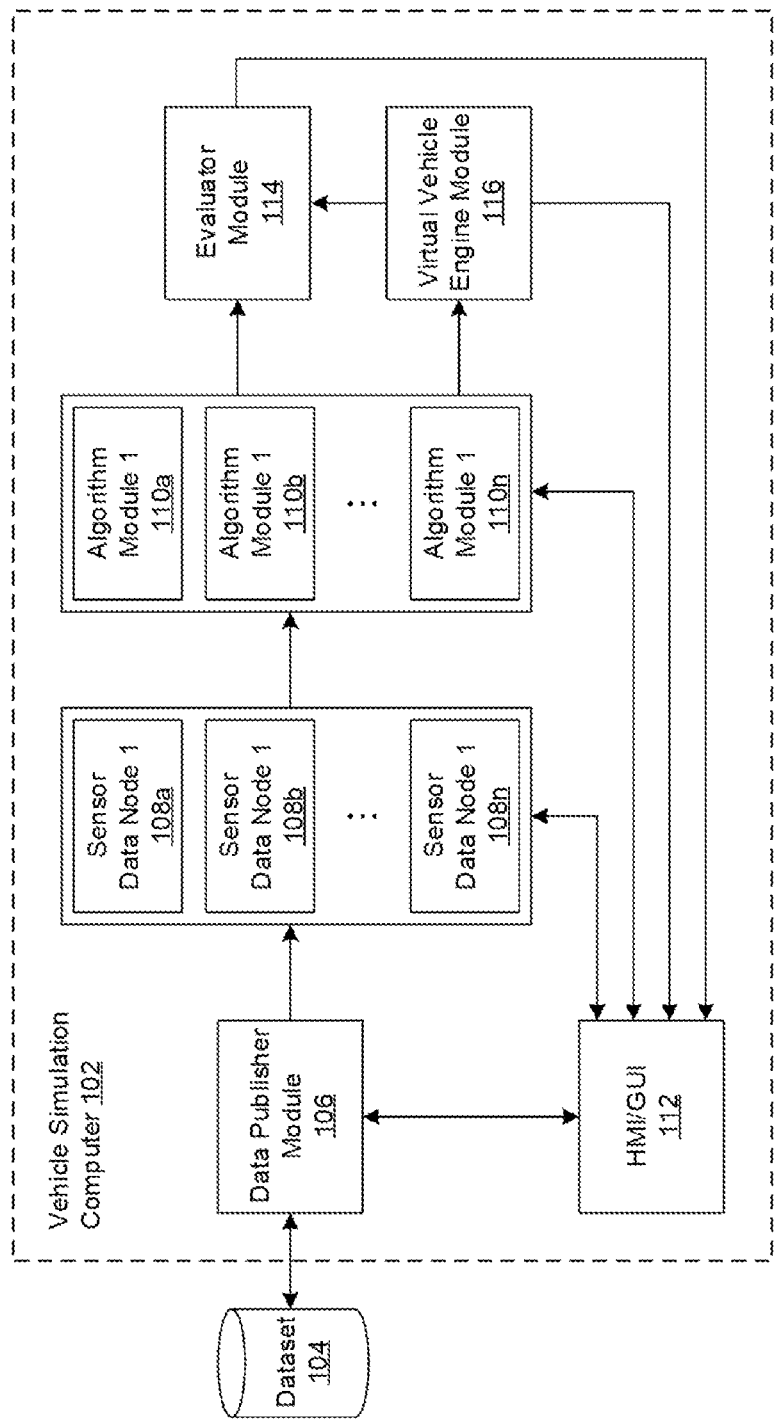
FIG. 1 shows an exemplary vehicle simulation computer that includes a data playback feature.

FIG. 1 shows an exemplary vehicle simulation computer 102 that includes a data playback feature. The vehicle simulation computer 102 can be used to play and analyze sensor data and/or to perform simulations based on real-world sensor data that can be retrieved from a dataset 104. The sensor data related dataset 104 may be located in a hard drive or a memory device, where the sensor data is obtained from an autonomous vehicle previously operated in the real-world. The sensor data for each sensor can be associated with a time stamp that indicates when the sensor obtained the sensor data. As further described in FIG. 2, the time stamp information can be used by the vehicle simulation computer 102 to limit the amount of sensor data that is received and processed.

The vehicle simulation computer 102 includes a data publisher module 106 that can retrieve the sensor data from the dataset 104. The data publisher module 106 can also separate the sensor data according to the type of sensor data. For example, the data publisher module 106 can obtain the camera 1 image data, camera 2 image data, and LiDAR sensor data from the dataset 104, and can separately store on the vehicle simulation computer 102 the camera 1 image data in sensor data node 1 (108a), the camera 2 image data in sensor data node 2 (108b), and the LiDAR sensor data in sensor data node 3 (108c) so that a user or the one or more algorithm modules 110a-110n can access relevant sensor data. Thus, the data publisher module 106 can be used to organize and store the retrieved sensor data according to the types of sensor data.

The sensor data organized by sensor data node 108a-108n can be accessed by one or more algorithm modules 110a-110n that can perform different types of operations related to autonomous vehicle driving. For example, algorithm module 1 can be a perception module that can obtain sensor data from one or more sensor data nodes 108a-108n to determine whether an object is located within a detection range of the autonomous vehicle. In another example, algorithm module 2 can be a control module that can generate one or more control signal values that can be used by the autonomous vehicle to steer or accelerate or brake, where the control signal values are generated based on the information that the control module receives from the perception module.

The vehicle simulation computer 102 can allow a user to debug an algorithm module and replace an old algorithm module having a known software bug with a revised algorithm module. In the context of the vehicle simulation computer, the term debug or error analysis is meant to describe a process to improve software code in algorithm modules to improve a driving behavior of an autonomous vehicle. Thus, in the context of the vehicle simulation computer, the term debug and error analysis are not limited to fixing syntactical software code or fixing software errors to improve runtime efficiency.

The vehicle simulation computer 102 can assign a version identifier (e.g., a version number) to be included in each algorithm module so that a developer or programmer can distinguish between an old algorithm module and a revised new algorithm module that fixes a known software bug with an old algorithm module. In some embodiments, the output generated by each algorithm module can be stored on the database 104 with each algorithm module's version number. Thus, a developer or programmer can determine the difference in software performance between two version of the same algorithm module. In this patent document, an algorithm module can also be referred to a program or a software program that performs an operation associated with autonomous vehicle. As further described below, the user can operate the human machine interface (HMI) 112 to determine whether the revised algorithm module has fixed an issue present in the old algorithm module and has improved the overall autonomous vehicle performance.

The vehicle simulation system includes an HMI 112 operating on the vehicle simulation system 102. An HMI is also known as graphical user interface (GUI). The HMI 112 can be used by a user to control several operations of the vehicle simulation computer 102. The HMI 112 can be used by a user to control the operations of the data publisher module 106. For example, when a user selects a relevant time period via the HMI 112 and optionally clicks a retrieve button on the HMI 112, the HMI 112 sends a command to the data publisher module 106 to retrieve the sensor data from the user-configured time period.

The HMI 112 can be used by a user to control the operations of the one or more sensor data nodes 108a-108n. The HMI 112 allows a user (e.g., programmer or developer) to play and/or analyze data from one or more sensor data nodes 108a-108n. For example, the HMI 112 may display a play button that when clicked on by a user allows the user to view the sensor data from one or more sensor data nodes 108a-108n. The HMI 112 may also include a user-configurable time period that allows a user to select a time period so that the HMI 112 can play data from one or more sensor data nodes 108a-108n within the user-selected time period.

In some embodiments, one or more sensor data nodes may be "disabled" to test what the algorithm modules and the overall autonomous vehicle will do if one or more sensors break or malfunction. The HMI 112 can be used to disable one or more sensor data nodes and/or a graphic processor unit (GPU) to perform simulation as further described in FIGS. 2 and 3. In some embodiments, the HMI 112 may enable a user to select specific sensor data node(s) from which data is requested to be played.

The HMI 112 can also be used by a user to control the operations of the one or more algorithm module 110a-110n. The HMI 112 can allow a user to operate the one or more algorithm modules 110a-110n in two modes. In a first mode, the HMI 112 may display another play button that when clicked on by a user allows the user to view the output of the one or more algorithm modules 110a-110n that process the sensor data received from the one or more sensor data nodes 108a-108n. In a second mode, the HMI 112 may display a run button that when clicked on by a user allows the user to run the functionality of the one or more algorithm modules so that a user can check whether his or her debugged code for a revised algorithm module has fixed an issue present in the old algorithm module and has improved the overall autonomous vehicle performance.

The exemplary vehicle simulation computer provides a robust debugging tool for autonomous vehicle driving simulations. After a programmer or a developer has fixed a software bug in one of the algorithm modules, the programmer can replace the old algorithm module with the revised algorithm module on the vehicle simulation system 102. The vehicle simulation computer 102 can perform a simulation with the revised algorithm module based on the exemplary operations described in FIG. 3. The output of the one or more algorithm modules 110a-110n can be one or more control signal values that can be used by the virtual vehicle engine module 116 to generate images to simulate a driving behavior of an autonomous vehicle as part of a simulation.

The virtual vehicle engine module 116 can obtain the one or more control signal values from the one or more algorithm modules 110a-110b. The virtual vehicle engine module 116 of FIG. 1 can determine the simulated driving behavior of the autonomous vehicle to be shown in image frames based on receiving the one or more control signal values. In some embodiment, the virtual vehicle engine module 116 may include a simulation software such as PhysX from NVIDIA that is programmed to receive from the one or more algorithm modules 110a-110n inputs such as position of the autonomous vehicle, rotation of the autonomous vehicle, current engine information (e.g., engine speed, gear status), and/or control signal values (e.g., brake percentage, throttle percentage, or steering angle). Based on the inputs received, the virtual vehicle engine module 116 can determine a new status information of the autonomous vehicle to be shown in the HMI 112 in a next image frame. For example, a new status information of the autonomous vehicle may be a new position of the autonomous vehicle and/or a new speed of the autonomous vehicle in the next image frame. In some embodiments, the virtual vehicle engine module 116 can generate and provide to the HMI 112 the next image frame as a visual output based on the new status information of the autonomous vehicle, where the HMI 112 can display the next image frame. In such embodiments, the virtual vehicle engine module 116 may generate image frames based on the determined status information of the autonomous vehicle after the sensor data is processed by the algorithm modules 110a-110n.

The evaluator module 114 can obtain the one or more control signals values from the one or more algorithm modules 110a-110b and can generate instructions for the control signal value(s) to be shown on the HMI or GUI 112. For example, the evaluator module 114 can generate instructions to indicate or display the one or more control signal values on an image in the HMI 112. The HMI 112 can receive the instructions for the control signal value(s) and can display the control signal value(s) as further shown as an example in control information 214 of FIG. 2. The evaluation module 114 can perform additional operations by receiving the one or more control signal values and receiving the new status information from the virtual vehicle engine module 116. In some embodiments, the evaluation module 114 can determine whether the autonomous vehicle is driving safely or comfortably by receiving the one or more control signal values and the new status information. For example, if the evaluation module 114 determines that a steering angle exceeds a first pre-determined value (e.g., more than 90.degree.) and that the current speed is greater than a second pre-determined value (e.g., more than 25 mph), then the evaluation module 114 can determine that the autonomous vehicle is not being driven safely. In another example, if the evaluation module 114 determines that the average of a braking percentage over a pre-determined time period (e.g., 3 seconds) exceeds a pre-determined value (e.g., more than 90%), then the evaluation module 114 can determine that the autonomous vehicle is not being driven safely. If the evaluation module 114 determine that the autonomous vehicle is not being driven safely, then the evaluation module 114 can generate and send to the HMI 112 an instruction to indicate a safety control signal (e.g., as an exclamation icon with a red flashing light) that can be displayed on the HMI 112 to indicate unsafe driving condition.

Figure 2:
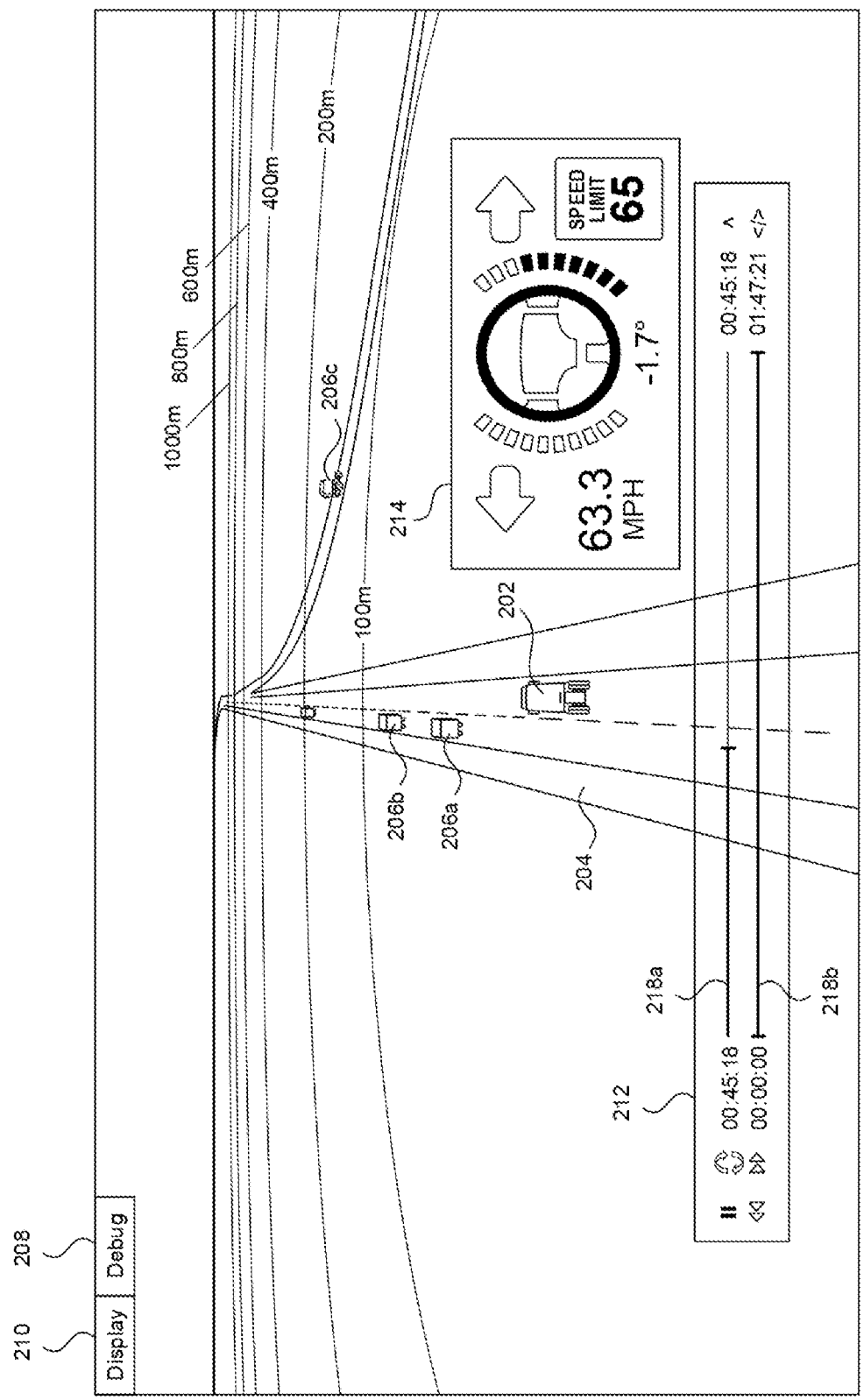
FIG. 2 shows an exemplary human machine interface (HMI) or graphical user interface (GUI) generated by a vehicle simulation computer for data playback and simulation.

FIG. 2 shows an exemplary HMI or GUI generated by a vehicle simulation computer for data playback and simulation. The HMI shows a bird's-eye view image of an autonomous vehicle 202 being driven on a simulated road 204 in a simulated environment. The HMI may generate the image frames that are displayed on the HMI in FIG. 2 based on the information received from the sensor data nodes 108a-108n, algorithm modules 110a-110n, evaluator module 114, and/or virtual vehicle engine module 116 as described in this patent document. For example, the driving behavior (e.g., speed and/or location) of the autonomous vehicle 202 on the image frame of the simulated road can be determined by the virtual vehicle engine module of the vehicle simulation computer based on the one or more control signal values obtained from the one or more algorithm modules 110a-110n. In another example, the HMI 112 can generate on an image frame information about other vehicles 206a-206b that surround the autonomous vehicle 202 based at least on the sensor data.

On top of FIG. 2, the HMI can include options for a user to simulate operations of the autonomous vehicle and/or to debut the algorithm module(s). The HMI can include a debug icon 208 that can be selected by a user to debug or change the software code in one or more algorithm modules that can be stored on the vehicle simulation computer. In some embodiments, a user can click on the debug icon 208 and can be presented with a GUI that allows the user to disable one or more sensor data nodes and/or a graphic processor unit (GPU) to perform simulation to determine how an autonomous vehicle's software system performs when sensor data node(s) and/or GPU is simulated to be malfunctioning. By disabling the sensor data node(s), sensor data associated with a disabled sensor data node may not be retrieved by an algorithm module during the simulation process.

Figure 3:
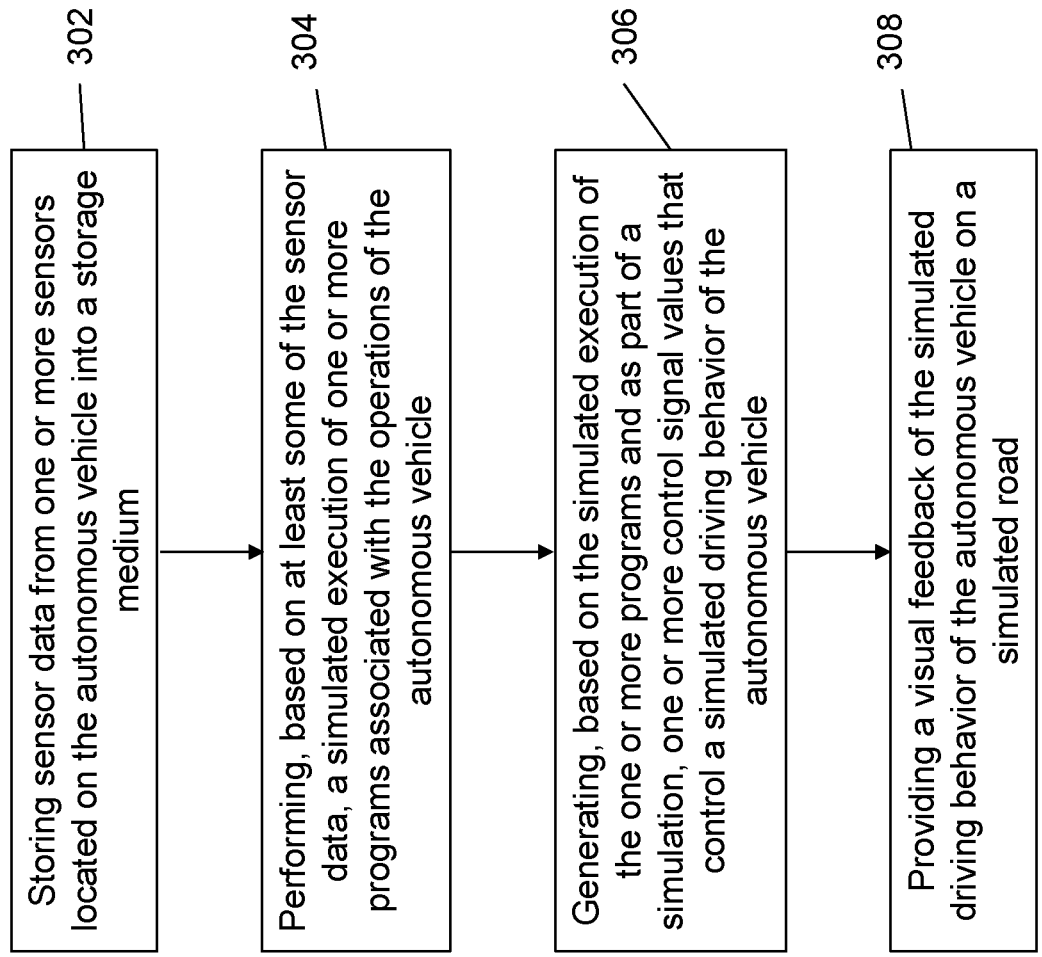
FIG. 3 shows an exemplary flow diagram of a simulation performed on a vehicle simulation computer with revised algorithm module.

On the top of FIG. 2, the HMI can also include a display icon 210 that can be selected to display the simulated road with the autonomous vehicle as shown in FIG. 2. The simulated road can include distance markers that indicate distances relative to and in front of the location of the autonomous vehicle. For example, as shown in FIG. 3, the generated HMI can include a first line at 100 meters, a second line at 200 meters, and an N-th line at 1000 meters. In some embodiments, the distance markers can be persistently shown so that a developer or a programmer can determine how the autonomous vehicle processes the sensor data for objects located at different distances.

As shown in the HMI of FIG. 2, the autonomous vehicle 202 can be surrounded by one or more other vehicles 206a-206b located on the road 204. The HMI also shows a vehicle 206c located on a highway or road on-ramp. The presence of the various vehicles around or near the autonomous vehicle 202 can be determined by one or more algorithm modules described in FIG. 1 based on the sensor data obtained from an autonomous vehicle previously operated in the real-world. Thus, the vehicle simulation computer can generate a visual representation of the one or more vehicle 206a-206c by receiving the real-world sensor data.

On the bottom of FIG. 2 is shown a control bar 212 that includes two status bars. The top status bar 218a shows that the simulation shown in FIG. 2 is at a 45 minute and 18 second mark in a recorded sensor data dataset that last up to 1 hour, 47 minutes, and 21 seconds. The top status bar includes a single slider that indicates that the simulation is at the 45 minute and 18 second mark. The single slider can be moved left and right on the top status bar 218a so that by changing the position of the slider, the simulation shown in FIG. 2 can be dynamically changed to correspond to the time associated with the slider. In some embodiments, when the slider of the top status bar 218a is moved to another position, the algorithm module(s) can process the sensor data associated with the time of the slider to generate control signal value(s) as described in this patent document. Thus, the exemplary vehicle simulation computer includes a data playback feature that can play the sensor data on a GUI with additional autonomous vehicle related information.

The bottom status bar 218b includes two sliders shown on the left and the right of the bottom status bar 218b. Both sliders can be moved left and right by a user on the bottom status bar 218b to indicate the relevant time period within which the sensor data is received and within which the simulation is being performed. As shown in FIG. 2, the HMI shows a simulation period between time t1=00 h:00 m:00 s and time t2 at 01 h:47 m:21 s. The two sliders of the bottom status bar 218b allow a programmer or developer to control the amount of sensor data that is received and processed by the vehicle simulation computer because the sensor data acquired by the autonomous vehicle is time stamped. For example, a programmer can control the left and right sliders of the bottom status bar 218b between the 30-minute, 15 seconds mark and the 35-minute, 45 seconds mark, respectively, to play the time stamped sensor data and view the autonomous vehicle's performance from within the selected time period. Thus, the two sliders on the bottom status bar 218b can improve computer simulation of autonomous vehicles at least because it can be used to control the amount of computation being performed by the vehicle simulation computer on the real-world sensor data.

The left side of the control bar 212 includes a set of controls that can be used to control the simulation. The set of controls include play/pause button, a repeat button, and a fast-forward and rewind button. The play/pause button starts or pauses the simulation shown in FIG. 3. The fast forward and rewind button fast forwards and rewinds in time the simulation shown in FIG. 3. The repeat button repeats the simulation within a time period indicted by the bottom status bar 218b once the simulation has recached the end of a time period indicated by the top status bar 218a.

The bottom right of FIG. 2 shows control information 214 with one or more control signal values. For example, the control information 214 shows that the autonomous vehicle is being steered to one side by having a steering angle of −1.7°. The control information 214 can also show the current speed of the autonomous vehicle (e.g., 63.3 mph) and the speed limit (e.g., 65 mph) of the road on which the autonomous vehicle is being driven.

FIG. 3 shows an exemplary flow diagram of a simulation performed on a vehicle simulation computer. At the storing operation 302, a vehicle simulation computer stores sensor data from one or more sensors located on the autonomous vehicle into a storage medium (e.g., a hard drive or a memory component of the vehicle simulation computer). Sensor data may be stored in a manner organized according to the sensor that generated the sensor data. For example, sensor data associated with camera #1 may be stored in a data set (e.g., folder) associated with camera 1, sensor data associated with LiDAR #2 may be stored in another data set associated with LiDAR #2, and so on. By organizing the sensor data by the sensor, one or more programs can retrieve the necessary sensor data to perform computations to assist simulation of autonomous vehicle driving. Furthermore, organizing sensor data by the sensor can enable a user to easily disable sensor data from a sensor to simulate that the sensor has malfunctioned.

At the performing operation 304, the vehicle simulation computer performs, based on at least some of the sensor data, a simulated execution of one or more programs associated with the operations of the autonomous vehicle. As an example, the one or more programs can process the stored sensor data to obtain a location of the autonomous vehicle and/or other vehicles that surround the autonomous vehicle at different points in time. In some embodiments, the at least some of the sensor data used for the simulated execution of the one or more programs excludes sensor data from a disabled sensor.

At the generating operation 306, the vehicle simulation computer generates, based on the simulated execution of the one or more programs and as part of a simulation, one or more control signal values that control a simulated driving behavior of the autonomous vehicle. In some embodiments, the one or more control signal values includes a steering angle value that steers the autonomous vehicle, a throttle value that adjusts a speed of the autonomous vehicle, or a braking value that adjusts an amount of brakes engaged by the autonomous vehicle. In some embodiments, the vehicle simulation computer further determines, based on the one or more control signal values, location and speed of the autonomous vehicle, where the visual feedback of the simulated driving behavior of the autonomous vehicle is based on the determined location and speed of the autonomous vehicle. In some embodiments, the vehicle simulation computer determines the location and speed of the autonomous vehicle in one or more images in a generated GUI.

At the providing operation 308, the vehicle simulation computer provides a visual feedback of the simulated driving behavior of the autonomous vehicle on a simulated road. In some embodiments, the vehicle simulation computer may generate a graphical user interface (GUI) that includes one or more images that show the autonomous vehicle on a simulated road, such as is shown in FIG. 2. In some embodiments, the visual feedback of the simulated driving behavior of the autonomous vehicle is provided by displaying the one or more control signal values. In some embodiments, the displaying the one or more control signal values includes displaying a difference between the one or more control signal values and a corresponding one or more previous control signal values.

In some embodiments, the vehicle simulation computer further receives a user-configurable time period information that controls an amount of the sensor data used for the performing of the simulated execution, where the sensor data used for the performing of the simulated execution includes time stamp that falls within the user-configurable time period information. In some embodiments, the vehicle simulation computer receives the user-configurable time period information via a GUI.

In some embodiments, the one or more sensors includes a camera, a radar, or a LiDAR. In some embodiments, the one or more programs includes a revised program that fixed a software issue with a previous program, where the revised program replaced the previous program, and where the revised program and previous program have different version identifiers. In some embodiments, the method further comprises determining, based on a comparison of at least one control signal value to a pre-determined threshold value, that the simulated driving behavior of the autonomous vehicle is unsafe, where the visual feedback of the simulated driving behavior of the autonomous vehicle includes displaying an indication of an unsafe driving condition.

The exemplary vehicle simulation computer described in this patent document can improve the debugging and error analysis process by having the computer reconstruct or recreate an autonomous driving scenario with real-world sensor data and with revised algorithm or software code for autonomous driving. A benefit of the vehicle simulation computer with data playback feature is that it can expedite the debugging and error analysis process at least because a programmer or developer can revise his or her code and can use the data playback feature to reconstruct an autonomous driving scenario by using the revised code to check whether his or her revisions improve the autonomous vehicle's performance. Thus, the vehicle simulation computer with data playback feature can test the overall system reliability of the autonomous vehicle system.

Figure 4:
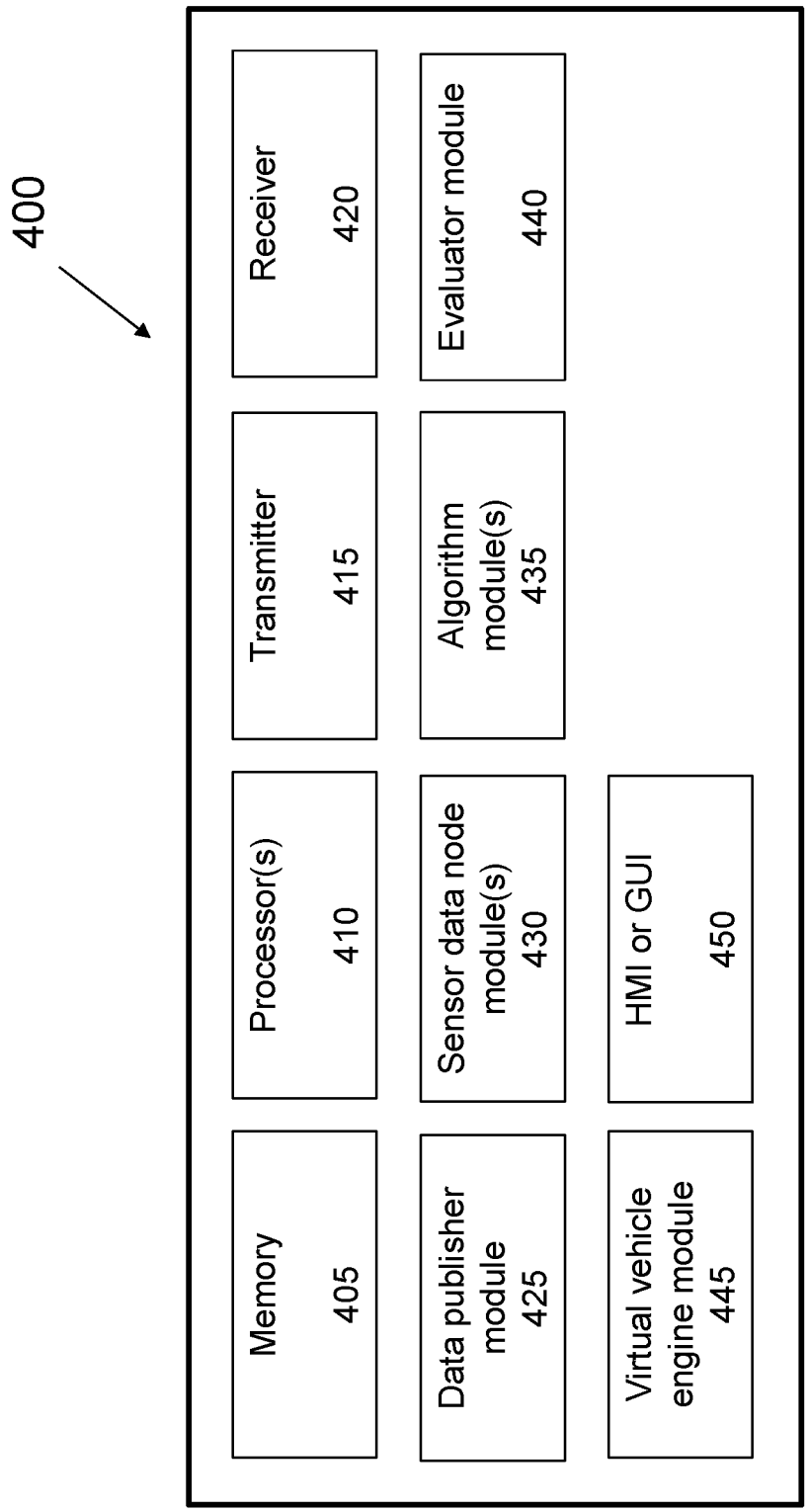
FIG. 4 shows an exemplary block diagram of a vehicle simulation computer.

FIG. 4 shows an exemplary block diagram of a vehicle simulation computer. The vehicle simulation computer 400 includes at least one processor 410 and a memory 405 having instructions stored thereupon. The instructions upon execution by the processor 410 configure the computer 400 to perform the operations described for the various modules, GUI, and/or HMI as described in FIGS. 1 to 3, and/or the operations described in the various embodiments or sections in this patent document.

In some implementations, methods described in the various embodiments in this patent document are embodied in a computer readable program stored on a non-transitory computer readable media. The computer readable program includes code that when executed by a processor, causes the processor to perform the methods described in this patent document, including the method described in FIG. 3. In this document the term "exemplary" is used to mean "an example of" and, unless otherwise stated, does not imply an ideal or a preferred embodiment.

Some of the embodiments described herein are described in the general context of methods or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media can include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes.

Some of the disclosed embodiments can be implemented as devices or modules using hardware circuits, software, or combinations thereof. For example, a hardware circuit implementation can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate protocols.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few implementations and examples are described and other implementations, enhancements and variations can be made based on what is described and illustrated in this disclosure.

What is claimed is:

1. A method of autonomous vehicle operation, comprising:
storing sensor data from one or more sensors located on the autonomous vehicle into a storage medium;
performing, based on at least some of the sensor data, a simulated execution of one or more programs associated with the operations of the autonomous vehicle;
generating, based on the simulated execution of the one or more programs and as part of a simulation, one or more control signal values that control a simulated driving behavior of the autonomous vehicle; and
providing a visual feedback of the simulated driving behavior of the autonomous vehicle on a simulated road by displaying the one or more control signal values, wherein displaying the one or more control signal values includes displaying a difference between the one or more control signal values and a corresponding one or more previous control signal values.

2. The method of claim 1, further comprising:
determining, based on the one or more control signal values, a location and a speed of the autonomous vehicle,
wherein the visual feedback of the simulated driving behavior of the autonomous vehicle is based on the determined location and speed of the autonomous vehicle.

3. The method of claim 1, further comprising:
receiving a user-configurable time period information that controls an amount of the sensor data used for the performing of the simulated execution,
wherein the sensor data used for the performing of the simulated execution includes time stamp that falls within the user-configurable time period information.

4. The method of claim 1, wherein the one or more control signal values includes at least one of a steering angle value that steers the autonomous vehicle, a throttle value that adjusts a speed of the autonomous vehicle, and a braking value that adjusts an amount of brakes engaged by the autonomous vehicle.

5. The method of claim 1, wherein the visual feedback includes a movable slider that when moved enables the visual feedback to show the simulated driving behavior of the autonomous vehicle that correspond to a time value associated with the moveable slider,
wherein the simulated driving behavior of the autonomous vehicle is dynamically changed by changing a position of the movable slider.

6. The method of claim 1, wherein the at least some of the sensor data used for the simulated execution of the one or more programs excludes sensor data from a disabled sensor.

7. The method of claim 1, wherein the one or more sensors includes a camera, a radar, or a LiDAR.

8. The method of claim 1, wherein the one or more programs includes a revised program that fixes a software issue with a previous program,
wherein the revised program replaces the previous program, and
wherein the revised program and previous program have different version identifiers.

9. A computer readable program stored on a non-transitory computer readable media, the computer readable program including code that when executed by a processor, causes the processor to:
store sensor data from one or more sensors located on the autonomous vehicle into a storage medium;
perform, based on at least some of the sensor data, a simulated execution of one or more programs associated with the operations of the autonomous vehicle;
generate, based on the simulated execution of the one or more programs and as part of a simulation, one or more control signal values that control a simulated driving behavior of the autonomous vehicle; and
provide a visual feedback of the simulated driving behavior of the autonomous vehicle on a simulated road by displaying the one or more control signal values, wherein to display the one or more control signal values, the processor is further configured to display a difference between the one or more control signal values and a corresponding one or more previous control signal values.

10. The computer readable program of claim 9, wherein the processor is further configured to:
determine, based on the one or more control signal values, a location and a speed of the autonomous vehicle,
wherein the visual feedback of the simulated driving behavior of the autonomous vehicle is based on the determined location and speed of the autonomous vehicle.

11. The computer readable program of claim 9, wherein the processor is further configured to:
receive a user-configurable time period information that controls an amount of the sensor data to be used for the performed simulated execution,
wherein the sensor data used for the performed simulated execution includes a time stamp that falls within the user-configurable time period information.

12. A system comprising:
a processor; and
a vehicle simulation module, executable by the processor, the vehicle simulation module being configured to:
store sensor data from one or more sensors located on an autonomous vehicle into a storage medium;
perform, based on at least some of the sensor data, a simulated execution of one or more programs associated with the operations of the autonomous vehicle;
generate, based on the simulated execution of the one or more programs and as part of a simulation, one or more control signal values that control a simulated driving behavior of the autonomous vehicle; and
provide a visual feedback of the simulated driving behavior of the autonomous vehicle on a simulated road by displaying the one or more control signal values, wherein to display of the one or more control signal values, the vehicle simulation module is further configured to display a difference between the one or more control signal values and a corresponding one or more previous control signal values.

13. The system of claim 12, wherein the vehicle simulation module is further configured to:
determine, based on a comparison of one or more control signal values, to a pre-determined threshold value, that the simulated driving behavior of the autonomous vehicle is unsafe; and
generate and send, to a human machine interface, an instruction to indicate a safety control signal that can be displayed on the human machine interface to indicate an unsafe driving condition.

14. The system of claim 12, wherein the vehicle simulation module is further configured to:
determine, if a steering angle of the simulated driving behavior exceeds a first pre-determined value and a speed is greater than a second pre-determined value, that the simulated driving behavior of the autonomous vehicle is unsafe.

15. The system of claim 14, wherein the first pre-determined value is 90 degrees, and wherein the second pre-determined value is 25 miles per hour.

16. The system of claim 12, wherein the vehicle simulation module is further configured to:
determine, if an average of a braking percentage of the simulated driving behavior over 3 seconds exceeds 90%, that the simulated driving behavior of the autonomous vehicle is unsafe, wherein the braking percentage comprises an amount of braking engaged by the autonomous vehicle.

\* \* \* \* \*